United States Patent [19]

Pease et al.

[11] Patent Number: 5,297,053
[45] Date of Patent: Mar. 22, 1994

[54] METHOD AND APPARATUS FOR DEFERRED PACKAGE ASSIGNMENT FOR COMPONENTS OF AN ELECTRONIC CIRCUIT FOR A PRINTED CIRCUIT BOARD

[75] Inventors: Mark D. Pease, Phoenix, Ariz.; William Anderson, Jr., Hillsboro, Oreg.

[73] Assignee: Computervision Corporation, Bedford, Mass.

[21] Appl. No.: 710,322

[22] Filed: Jun. 4, 1991

[51] Int. Cl.⁵ ............................................. G06F 15/46
[52] U.S. Cl. .............................. 364/474.24; 364/488; 364/491
[58] Field of Search ............... 364/488, 489, 490, 491, 364/474.24

[56] References Cited

U.S. PATENT DOCUMENTS

| | | | |
|---|---|---|---|
| 4,803,636 | 2/1989 | Nishiyama et al. | 364/491 |
| 4,975,854 | 12/1990 | Yabe | 364/491 |
| 5,031,111 | 7/1991 | Chao et al. | 364/491 |
| 5,046,017 | 9/1991 | Yuyama et al. | 364/491 |
| 5,097,422 | 3/1992 | Corbin, II et al. | 364/491 |
| 5,164,908 | 11/1992 | Igarashi | 364/491 |
| 5,198,987 | 3/1993 | Shindo et al. | 364/490 |

*Primary Examiner*—Jack B. Harvey
*Assistant Examiner*—Thomas Peeso
*Attorney, Agent, or Firm*—Wolf, Greenfield & Sacks

[57] ABSTRACT

A computer aided design tool provides a user with the capability of generating a design implementation for electronic circuitry. In this system the user generates a design schematic specifying a functional description of a design for electronic circuitry without the need for specifying packaging information. The system is provided with a packaging tool for generating a physical package for the circuitry of the design schematic. Use of the packaging tool may be deferred until the design schematic has been completed and verified. Further, a user of the system has the option of specifying certain packaging information when creating the design schematic or delaying such specification until just prior to packaging of the design.

30 Claims, 13 Drawing Sheets

```
c:*req*
(package)model:*req*
primitive: cap
ref:*opt* gate:A
parameters:c
functype: cap
comment: capacitor
revision: THEDA_1.1
```

METHOD AND APPARATUS FOR DEFERRED PACKAGE ASSIGNMENT FOR COMPONENTS OF AN ELECTRONIC CIRCUIT FOR A PRINTED CIRCUIT BOARD

FIELD OF THE INVENTION

The present invention relates generally to computer aided design systems and, more particularly, to computer aided design systems for generating electronic circuitry designs.

DESCRIPTION OF THE PRIOR ART

Conventional computer aided design systems for electronic circuitry have allowed a designer to create a schematic design to implement the electronic circuitry. Unfortunately, the creation of this schematic design has necessarily entailed specification of packaging information at the time of schematic development. In particular, when the user selects a particular functional symbol in the schematic, either the user has been forced to specify the package in which to implement that component, or the system has automatically assigned a particular physical package for that component. This has forced designers of electronic circuits to make functional design decisions simultaneously with packaging design decisions.

It is, therefore, an object of the present invention to provide a computer aided design system for electronic circuits to allow creation of a functional description of a design without the need for specifying physical packaging of the design.

It is a further object of the present invention to provide a computer aided design system wherein packaging decisions are deferred until the functional design of the circuitry has been completed.

SUMMARY OF THE INVENTION

The foregoing objects are realized in a computer aided design system which includes a means for creating a design schematic. The design schematic may be similar to conventional electronic schematics and provides a functional specification of the design for the electronic circuitry. The computer aided design system additionally includes a means for creating at least one model schematic which provides packaging information about the design. This means is generally the same tool used to create the design schematics. The difference between the design schematics and the model schematics lies in the properties placed on the schematics as will be discussed in more detail below. The model schematic, however, is separate from the design schematic, and, hence, the user of the system need not specify the two jointly. Rather, the design schematic may be generated and subsequently the model schematic may be generated.

An additional component of the computer aided design system is a means for mapping the model schematic into the design schematic. This means brings the packaging information contained within the mode schematic into the design schematic to generate a packaged design for the electronic circuitry. The computer aided design system preferably includes a means for a user of the system to manually specify which model schematic is to be mapped to a portion of the design schematic by the means for mapping. In addition, it preferably includes a means for the system to automatically specify which schematic is to be mapped to a portion of the design schematic by the means for mapping. This means provides the capability for a user of the system to manually specify the relationship between the design schematic and the model schematic.

The design schematic may comprise functional symbols representing functions of components in the design. It may also comprise properties which are associated with the respective functional symbols. These properties provide information regarding the function of the associated functional symbols. For instance, one of the properties may specify the function performed by the component represented by the functional symbol. The properties of the functional symbols in a design schematic may include or not include packaging information. As such, a user may provide packaging information prior to the mapping performed by the means for mapping.

The model schematic may comprise a model symbol representing a particular packaging of functional symbols of a design schematic. Preferably, the model schematic further comprises properties that are associated with the model symbol. These properties provide relevant packaging information regarding the model symbol.

The computer aided design system may also include other additional components. For instance, it may include a display for displaying the design schematic, the model schematic or the packaged design.

The packaging of a design for electronic circuitry is implemented on a computer by first creating the design schematic. Subsequently, at least one model schematic is created and then, lastly, the model schematic is mapped to the design schematic to generate the packaged design. An intermediate step that may be manually performed is to specify what model schematic is to be mapped into a portion of the design schematic. As mentioned above, this may also be performed automatically by the computer.

The computer aided design system may be implemented on a data processing system having a memory. This memory is used to hold the design schematic and the model schematics. The data processing system further includes a processing means for generating the packaged design schematic. The processing means interacts with the display to display the design schematic, the model schematic and/or the packaged design schematic.

DETAILED DESCRIPTION OF A PREFERRED EMBODIMENT

Figure 1:
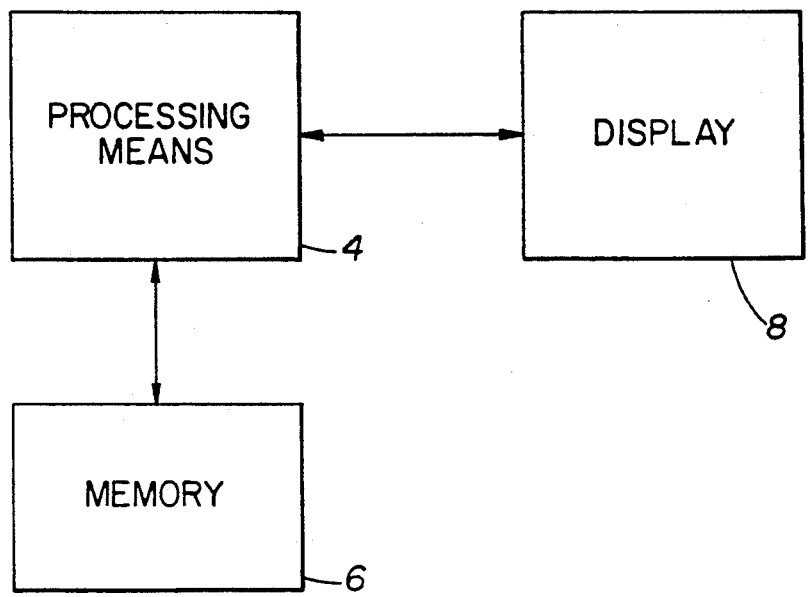
FIG. 1 is a block diagram depicting the components of a data processing system in which the computer aided design system may be implemented.

In accordance with the present invention, a unique electronic computer aided design system allows a user to interactively develop a design schematic for electronic circuitry without the necessity of specifying packaging information during the development of the design schematic. The electronic computer aided design system is run on a conventional data processing system such as that depicted in FIG. 1 having a processing means 4, a memory 6, a long term memory 2 and a display 8. The electronic computer aided design system may be decomposed into several distinct software tools. In particular, it may be decomposed into a design tool for developing electronic design schematics, a simulation tool for simulating proposed designs to verify their correctness, a packaging tool for packaging verified designs and a board layout tool for laying out the design packages on a printed circuit board.

Figure 2:
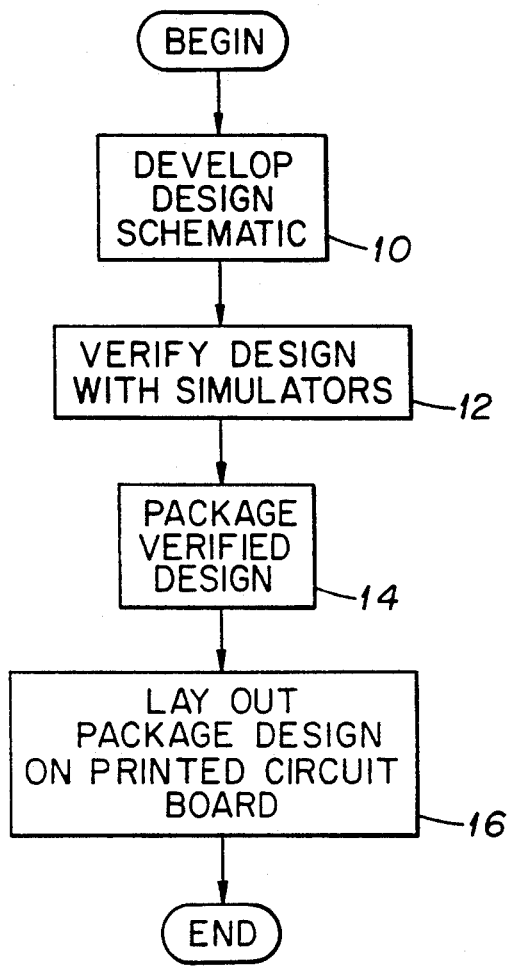
FIG. 2 is a flow chart of the basic steps involved in the creation of a design with the computer aided design system.

FIG. 2 presents a flow chart of the major steps in the development and layout of a circuit using the electrical computer aided design system. In particular, initially an electronic design schematic is developed using the design tool (step 10). Subsequently, the design is fed through the simulator tool (step 12) which verifies whether the design is sound. It should be appreciated that multiple simulator packages may be employed and that the simulator packages may provide the capability of flagging errors within a design. Next, the verified design is packaged into a physical package using the packaging tool (step 14). Finally, the packaged design is laid out on a printed circuit board using the board layout tool (step 16).

A number of electronic computer aided design systems are known in the prior art. So as to focus on the novel aspects of the present invention, the discussion that follows will focus on the unique packaging tool employed in this invention. However, for illustrative purposes, the discussion that follows will focus on an implementation of the present invention that is integrated into the THEDA design system sold by Computervision Corporation.

Figure 3:
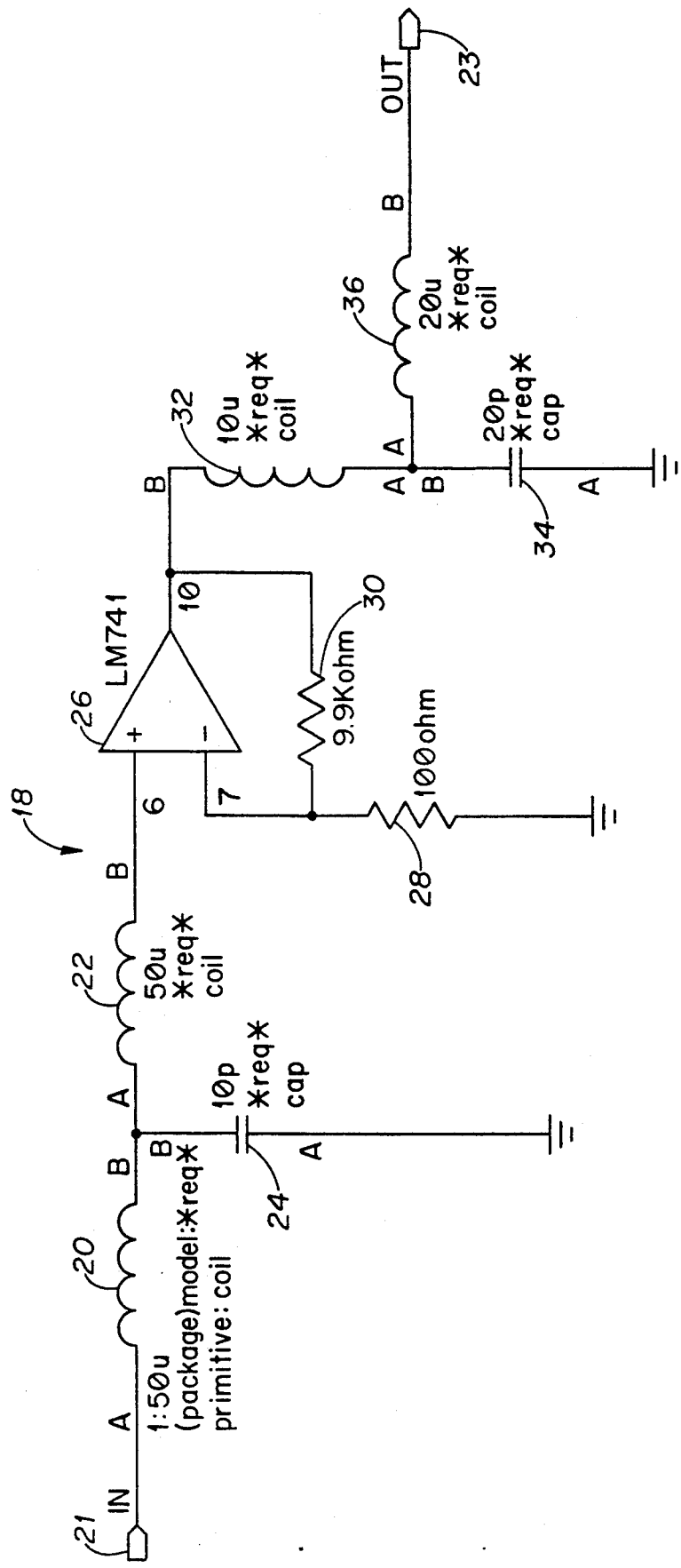
FIG. 3 is an example of a design schematic produced by the computer aided design system.

In order to explain the packaging tool and its operation, it is useful to first examine an example design schematic, like the design schematic 18 shown in FIG. 3. This design schematic is merely illustrative and is not intended to perform any well known functions. Design schematics are what are received as input by the packaging tool which processes the design schematic to produce a packaged design. Typically, each design schematic constitutes a separate file in the data processing system. The depiction in FIG. 3 shows the design schematic as it would appear on display to a user of the system.

As can be seen in FIG. 3, the schematic 18 is comprised of instances of design symbols, wire connections and property information for each of the symbols. The instances of design symbols in the design schematic generally do not specify physical packaging information but rather only specify functional information. Each instance of a design symbol may represent a complete device or merely a gate in a device. The design schematic employs conventionally known symbols to designate electrical components. Hence, the commonly used spiral symbol is employed in the design schematic to indicate an inductor 20.

The schematic 18 employs a number of different design symbols to represent circuit components. For instance, the input to the circuit of the design schematic is indicated by an input symbol 21 labeled "IN", and the output to the circuit of the design schematic is indicated by an output symbol 23 labeled "OUT". The design schematic of FIG. 3 also includes design symbols 20 and 22 for representing series connected inductors. The design schematic, in addition to providing design symbols for the inductors 20 and 22, also specifies their respective ports "A" and "B".

The design schematic 18 of FIG. 3 further includes an instance of a design symbol 24 representing a capacitor that is connected between the inductors 20 and 22. Moreover, the instance of the symbol 22 for the inductor is shown as connected to the non-inverting input of a design symbol 26 which represent an amplifier. The inverting input of this amplifier 26 is shown as coupled to a branch having an instance of a design symbol 28 denoting a resistor. The instance of resistor design symbol 28 is joined by a feedback loop having of instance of a design symbol 30 representing a second resistor. Still further, the schematic 18 includes two additional instances of design symbols 32 and 36 which represent inductors. Lastly, the design schematic includes an instance of a design symbol denoting a second capacitor 34.

As mentioned above, the design schematic 18 also includes property information of the design symbols it contains. Specifically, each instance of a design symbol in the design schematic has a number of properties associated with it. The properties specify relevant information about the instance of the design symbol with which they are associated. Certain of these properties are defined for each type of design symbol, and other properties are only defined for select design symbols.

Some of these properties are listed adjacent to their respective design symbols in FIG. 3. The properties defined for each instance of a symbol are:

1) the primitive property; and
2) the functype property.

The primitive property value is specifically designed for a link with the schematics and some other tool such as a simulator or the circuit board layout tool. The primitive property value tells such software tools what sort of device the design symbol represents. This value is specific to the target software tool. Hence, there may be several qualified primitive properties for the same design symbol. What is meant by qualified primitive property will be discussed in more detail below. The functype property, in contrast, is used to match functional symbols in the design schematic with functional symbols in the model schematic. It is used only by the packaging tool for matching purposes.

The functype property identifies whether the design symbol is a function symbol or a preassigned symbol. A preassigned symbol is a design symbol which has a preassigned package associated with it. The system automatically assigns the package associated with a preassigned symbol to each instance of the preassigned symbol in the design schematic. A function symbol, in contrast, does not contain preassigned package information; rather the user must explicitly assign package information to it. The presence of a value for the functype property indicates that the design symbol is a function symbol rather than a preassigned symbol.

The optional properties for the instances o design symbols can be divided into two categories: Those requiring a default value and those not requiring a default value. The properties that require a default value are:
1) the parameters property;
2) the comment property;
3) the data origin property; and
4) the revision property.

The parameters property defines names of additional properties that are associated with a design symbol. The role of the parameters property will be more apparent in the discussion below, but it suffices for present purposes to note that it provides a mechanism for adding additional properties to a design symbol. The comment property provides additional displayable information about the design symbol. The data origin property specifies an identification that is used by other software tools of the system. Lastly, the revision property is used as an identification.

The optional properties associated with design symbols that do not require default values include:
1) the (package)model property;
2) the ref property;
3) the gate property; and
4) the pin port property.

The (package)model property identifies the type of package assigned to a symbol. As will be discussed below, the value of this property is used to associate a model schematic with a design symbol. The ref designator provides an alpha numeric identifier that uniquely identifies an instance of a component to be placed on a circuit board that the design symbol in the design schematic is mapped to. As such, multiple instances of design symbols in the design schematic may share the same ref designator. The gate property identifies the gate of the packaged symbol and the pin (port) supply pin names for the ports of the packaged symbol in the design symbol. These last four listed symbol properties typically do not initially have a value; rather only after being packaged do they typically obtain values.

Figure 4:
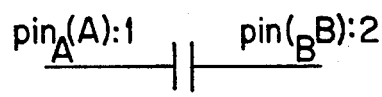
FIG. 4 is an example of a functional symbol generated by the computer aided design system.

FIG. 4 provides an illustration of a function symbol for a capacitor along with its associated property values (which are listed below the symbol). As can be seen in FIG. 4, the conventional capacitor symbol is depicted with designations for ports "A" and "B". A separate pin is assigned to these respective ports as indicated by the properties "pin(A):1" and "pin(B):2". These property values "1" and "2", however, are meaningless and merely serve as placeholders for values to be obtained. FIG..4 also lists some of the properties of the function symbol. Specifically, the statement "primitive:cap" indicates that the device type represented by the symbol is a capacitor (denoted as "cap"). Further, the statement "(package) model:*reg*" indicates that a package model is not yet assigned to this symbol. The "*reg*" portion of this statement indicates to library routines of the system that no value has yet been assigned to this property but a value is required before packaging is completed. Similarly, the "*opt*" notation indicates to the library routines of the system that no value has been assigned to the property but the value may optionally be included before packaging is completed. Hence, the statement "ref:*opt*" indicates that a value has not yet been assigned to the ref property but will be back annotated to the property once packaging is completed. Furthermore, the statement "gate:A", the "A" merely serves as a placeholder.

Additional properties listed in FIG. 4 include the parameters property. In particular, the statement "parameters:c" indicates that the symbol includes a property c, and the statement "c:*reg*" indicates that this propert has not yet been assigned a value as discussed above. In this instance, the c property indicates the capacitance of the capacitor. Further, the "functype:cap" statement indicates that the function symbol is a function symbol for a capacitor, and the statement "comment:capacitor" displays to the user that this symbol is a capacitor. Moreover, the statement "revision:-THEDA_1.1" indicates that this is the function symbol definition for the THEDA version 1.1, electronic computer aided design system.

A model schematic, in contrast to a design schematic, is a file that contains packaging and connectivity information for a portion of a design represented by a design schematic. It specifies what function symbols are used, how the function symbols must be connected to make a gate equivalent, and how many gate equivalents may be placed in one package. In other words, it specifies the actual physical implementation of a given functional design.

The packaging tool maps the packaging defined by model schematics into the function symbols of the design schematic. This mapping allows the packaging of the design specified in the design schematic to be implemented. Specifically, the packaging tool assigns ref, pin and gate properties to each of the function symbols in the design schematic. Before discussing the details of the symbol mapping process, it is necessary to first discuss what model schematics are in more detail.

Figure 5A:
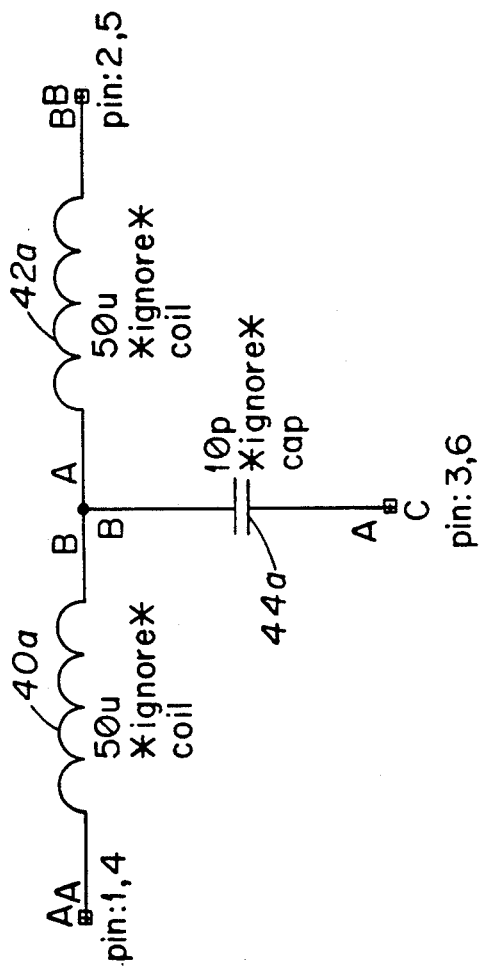
FIGS. 5a and 5b are examples of model schematics generated by the computer aided design system.
Figure 5B:
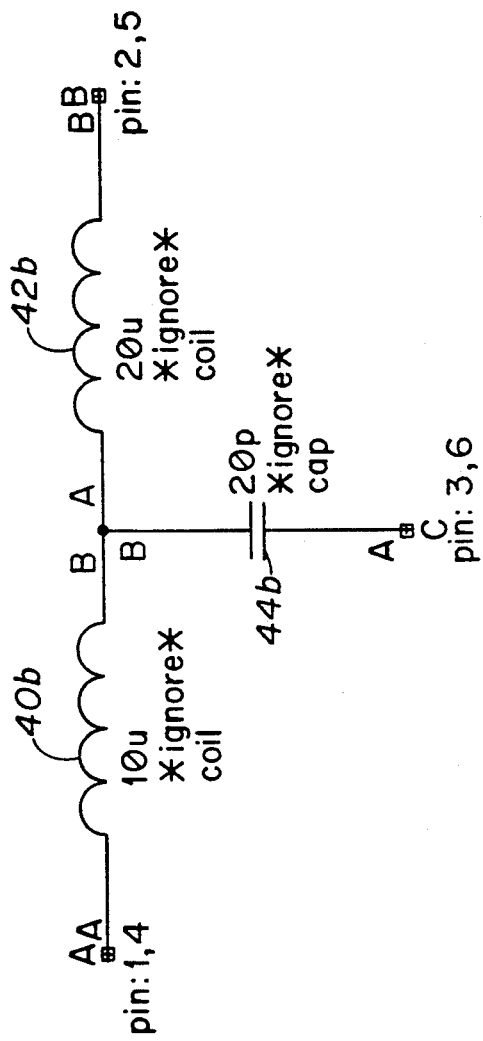

A better understanding of model schematics can be obtained by looking at examples like those shown in FIGS. 5a and 5b. These Figs. each depict a separate model schematic for a respective packaging of a T filter. Every model schematic includes a frame symbol. The frame symbol is a place in a model schematic to hold properties that apply to the model schematic page as a whole. It frequently contains graphics that comprise a border within which the rest of the symbols are placed. For example, the model schematic of FIG. 5a includes a frame symbol which has on it the properties specified in the lower left hand corner. Likewise, the model schematic of FIG. 5b includes a frame symbol having on it properties similar to those shown in FIG. 5a.

On the frame symbol, every model schematic includes a number of properties associated with the package represented by the model schematic. Required properties for each frame symbol are the following properties:
1) the pack property;
2) the num_pins property; and
3) the gate property.

The pack property specifies a particular package name for the package that the model schematic represents. The value of the pack property is an identifier of a physical package known to the board layout tool. The num_pins property specifies the number of pins in the package. Lastly, the gate property specifies the gate names of the package.

Other properties associated with a frame symbol of a model schematic include the following optional properties:
1) the noconnect property;
2) the partcode property; and 3) the consort property.

The noconnect property identifies pins in the package that are not connected. The partcode property indicates the customer's part number for the package. In order to understand what the consort property specifies, it is necessary to first examine the types of components that each model schematic may present. In particular, a model schematic may represent a single element component, but a model schematic may also represent a multiple element component. In such a case, the multiple elements that make up the component may be of the same type or of different types. The elements are known as gates. A component that has dissimilar types of gates is known as a consort. As such, the consort property lists the names of the other model schematics (i.e., its consorts) that make up the component.

Properties ar also provided to specify the locations of power pins and ground pins. Hence, the following properties are additionally provided:
1. The ppin property; and
2. the connect property.

The ppin property identifies the physical pins to which the power and ground pins are connected. The syntax is "ppin(port name):physical pin name". Both the power and ground are considered as power pins. The connect property is used to connect all ports of the same kind to common global nodes. It facilitates the connection of invisible ports.

Given this explanation of the properties provided for each frame symbol, it is useful to further examine the model schematics of FIGS. 5a and 5b. In FIG. 5a, the package shown includes the combination of the inductors 40a, 42b and the capacitor 44a. This package has two gates denoted as "A" and "B", respectively. The gate property works in conjunction with the pin property. Thus, for the example given, gate "A" is assigned pins 1, 2 and 3, and gate "B" is assigned pins 4, 5 and 6. Moreover, the properties for the package are given below the package symbol in FIG. 5a. The statement "num pins:6" indicates that the package has six pins. The statement "pack: dip-6" indicates that the layout package identification for this package is dip-6. Furthermore, the statement "gate:A,B" indicates that the package has two gates denoted as "A" and "B". The part code for the package is 4H683 (as indicated by the statement "partcode:4H683").

The model schematic of FIG. 5b is like that of FIG. 5a in most respects, except that its part code is 4H684 and the capacitances of the capacitors and the inductances of the inductors differ as represented by the value of their C and 1 properties, respectively. Thus, the part numbers identify a distinction between these packages.

A model schematic also includes property information regarding the functional symbol(s) contained therein. In particular, for the model schematics of FIGS. 5a and 5b information such as the capacitance of the capacitors 44a and 44b and the inductance of the inductors 40a, 40b, 42a and 42b is shown. Further, the statements "*ignore*" indicate that the model schematic creator has directed the system library routines to ignore the required (package)model property in this context. The user does this by assigning the value of *ignore* to the (package)model property. Also shown for the function symbols are the values of their primitive properties (e.g., "coil" and "cap").

In order to perform deferred packaging, the user of the system must develop two libraries. The first library is made of the function symbols and the second library is made of the model schematics. Typically, the person who created the design schematics and the person who creates the model schematics are different people Once both libraries have been developed and the user has completed the design, symbol mapping is performed. As mentioned above, symbol mapping is the process wherein the model schematics are mapped to associated design schematics. The result of the mapping is a packaged design which may be passed to the board layout tool to configure the packaged design on a printed circuit board.

Before the design can be passed through the packaging tool, the user of the system must provide instance values for primitive and (package)model properties on every function symbol in the design schematic. As discussed above, the primitive property points to a particular component name in the layout software tool, whereas the (package)model property assumes a value that points to a particular model schematic. By assigning a (package)model value for each function symbol in the design schematic, a link is established that points to a respective model schematic that contains the corresponding function symbol(s).

Related to assignment of packaging information is the notion of qualifiers. A qualifier is a label on a property which allows a user to make the same design look different to different software tools. A qualifier of particular interest is the (pkgr) qualifier. It indicates what properties were added or modified by the packaging tool. Hence, it allows a user to decide whether to include properties added by the packaging tool in a subsequent packaging run.

The system provides an option -Q which tells the packaging tool which labels to recognize during a current packaging run. When the packager is given the pkgr qualifier with this option, it does not change any existing instance properties for previously packaged components. Further, it adds the (pkgr) qualifier to every property it adds. In contrast, when the packaging tool is run without this option it deletes all properties already having the (pkgr) qualifier and adds the (pkgr) qualifier to all properties it adds or modifies.

Figure 6:
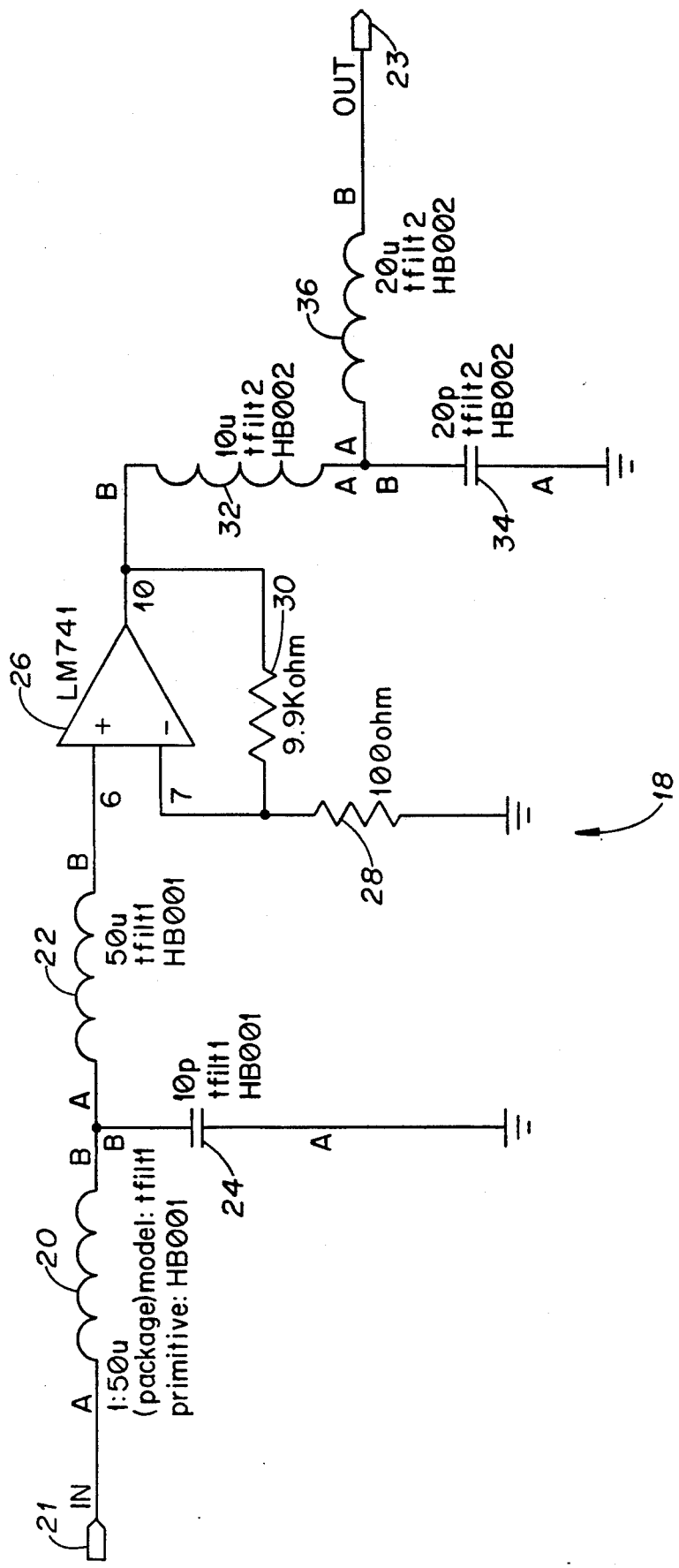
FIG. 6 is a depiction of the design schematic of FIG. 3 after the model schematic has been assigned respective packaging information.

An example of assignment of package information by a user is shown in FIG. 6. which depicts the schematic 18 (which is shown prior to package assignment in FIG. 3) after appropriate package assignments have been made. Thus, the inductor function symbol 20 has been assigned a (package)model property that points to the first T filter model schematic (i.e., "tfilt1") shown in FIG. 5a. Similarly, the inductor 22 and the capacitor 24 have been assigned this same (package)model property value. Also, a primitive value of "HB001" has been assigned to these components 20, 22 and 24. The second set of inductors 32 and 36 and the capacitor 34, however, have been assigned a different (package)model property value. In particular, they have been assigned the (package) model property value of "tfilt2", which is shown in FIG. 5b. As such, they have also been assigned the primitive property value of "HB002". In other words, the two respective T filters in the design schematic of FIG. 6 have been assigned different packages as represented by the model schematics of FIGS. 5a and 5b.

It should be appreciated that certain packaging may be performed on the function symbols prior to passage of the design schematic through the packaging tool. This type of packaging is referred to as hand packaging.

Hand packaging is performed by a user of the system by assigning ref, pin, and/or gate properties to a symbol. The hand packaging is noted by the packaging tool (by virtue of the property(s) lack a pkgr qualifier) and when an input design is processed, the hand packaged information is not altered.

Figure 7:
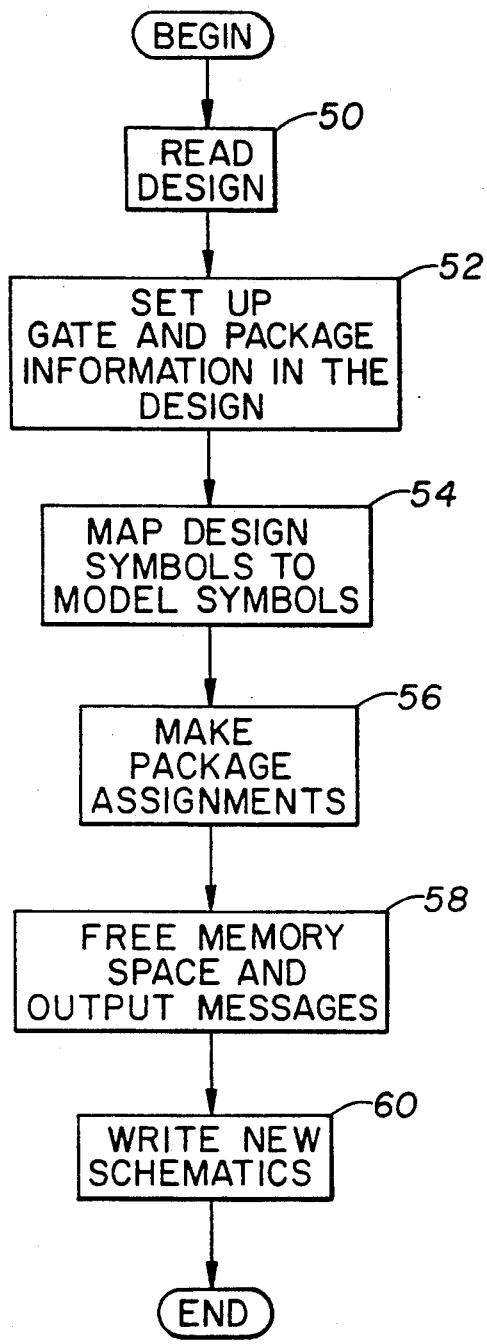
FIG. 7 is flow chart depicting the steps of the packaging process performed by the packaging tool.

The packaging process can be divided into a number of steps as shown in the flow chart of FIG. 7. The first step performed in the packaging process is reading the design input file and converting it into an internal database format (step 50). This conversion places the input in a form usable by the packaging tool. If a complete design cannot be found, processing of the input data ceases.

Next, the packaging tool sets up gate and package information in the design (step 52). In order to do this, the tool evokes a routine which makes a preliminary pass through the design data. During this pass, any ref, gate, and pin properties that have been hand assigned are recognized. Furthermore, function symbols are recognized by checking for the presence of the functype property on each of the design symbols. If a symbol has a functype property, the system assumes the symbol is a function symbol with no direct packaging information. When the routine encounters a function symbol, it reads the (package)model property value for the symbol and uses the value of that property to identify the name of an associated model schematic file. In other words, this value is used to denote a correspondence with a model schematic. The packaging tool then searches the data file path for the identified model schematic.

At the completion of the setting up step 52, the system has a list of all the function symbols and has annotated them with any user-supplied packaging information. It also has a list of all the model schematics referenced by the function symbols so it knows how many kinds of gate equivalencies there are. It, likewise, has a list of all preassigned symbols.

Figure 8:
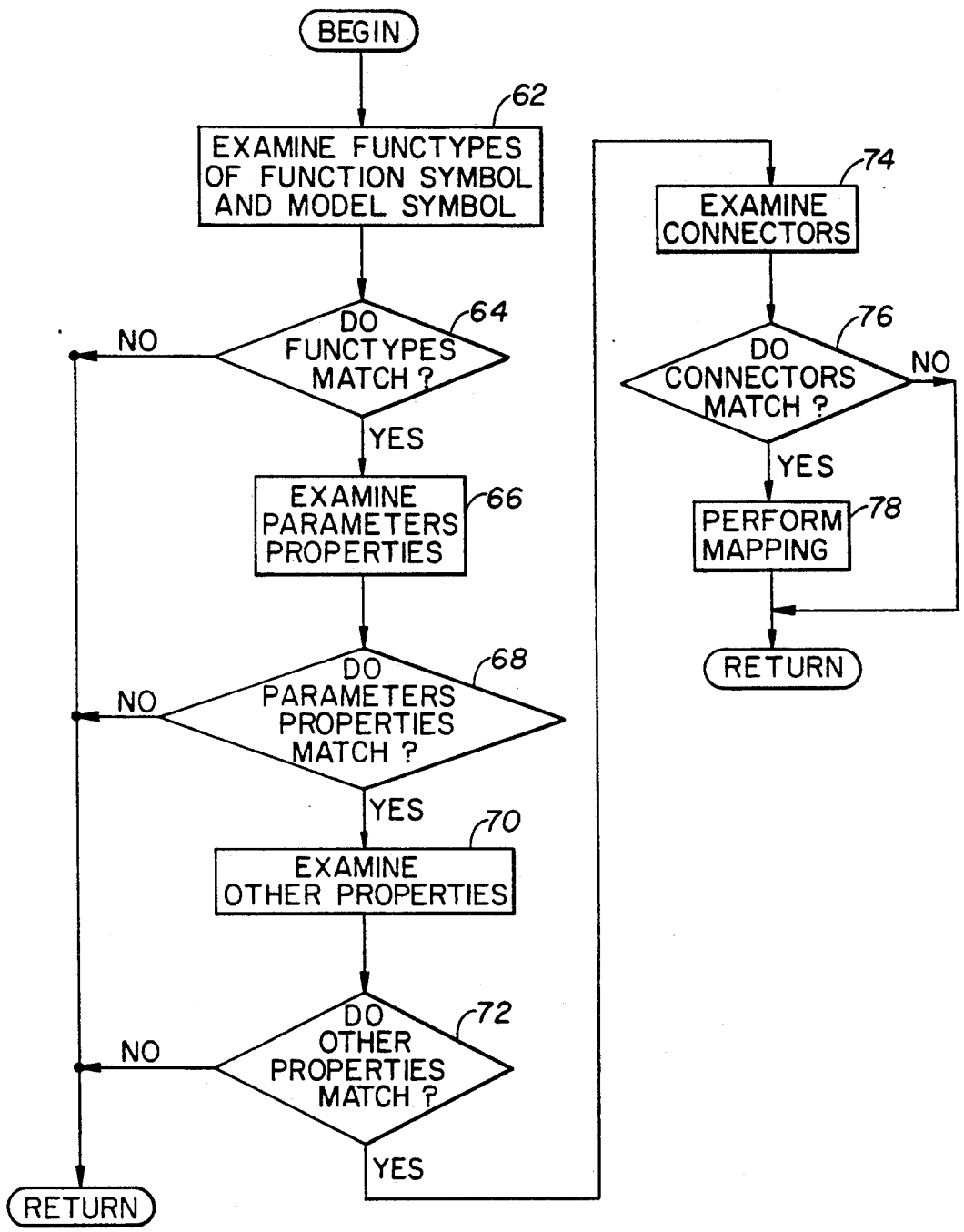
FIG. 8 is a flow chart depicting the steps involved in the mapping step (54) of FIG. 7.

The system next maps the design symbols to the model symbols (step 54). As has been mentioned above, a model schematic defines a gate equivalent. During this mapping step 54, the system attempts to match the function symbols of the design schematic to corresponding model symbols in the model schematics. FIG. 8 presents a flow chart of the steps involved in the mapping process. The flow chart assumes that a model symbol and a design symbol have already been selected. The first step then is to examine the functypes of the function symbol and the model symbol (step 62). The packaging tool then checks to see whether the functypes match (step 64). If the functypes match, the packaging tool then proceeds to examine the parameters properties of the model symbol and the function symbol (step 66). Once again, it checks to see whether these properties match for the function symbol and the model symbol (step 68). If the parameters properties also match, the system examines other properties (step 70) and determines whether these other properties match (step 72). If there is a mismatch in any of these properties, the system proceeds to examine other pairs of symbols to find a match.

In contrast, if there is a match between the symbols, the tool examines the connections in the connectivity check (step 74). If the results of the connectivity check indicate that the connections match (step 76), the mapping of the symbols is performed (step 78).

A more detailed depiction of the steps involved in the connectivity check is provided in FIGS. 9a, 9b, 9c and 9d. Initially, the design symbol and model symbol are marked as "used" so that they will not be used later in the connectivity check (step 80). By marking the symbols as "used", the packaging tool initially presumes a match will occur. If this match proves to be failed, the symbols will later be marked as "unused" a will be discussed below. Once the design symbol and model symbol have been marked as "used", the next port is selected from the model symbol (step 82). The system then checks to see whether all of the ports for the model symbol have already been used (step 84). Initially, assume that all of the ports have not been used. In this case, the system makes a list of ports that are connected to the current model symbol port (step 86). From this list, the system selects a next model port that is an unused model symbol (step 88). For this new model symbol, the system then checks to see if all of the ports have been used. If all of the ports have been used, the system then checks to see if the found flag has been set (step 102). The found flag is an indication that a port has been found that is not used. In the event that a found flag is not set, the system returns to the routine beginning with step 82 of selecting a next port from the model symbol. In contrast, if the found flag is indeed set, the system branches to the routine designated as A in FIG. 9a. The system also branches to the routine designated as A if all of the ports have been determined as used in step 84.

Figure 9A:
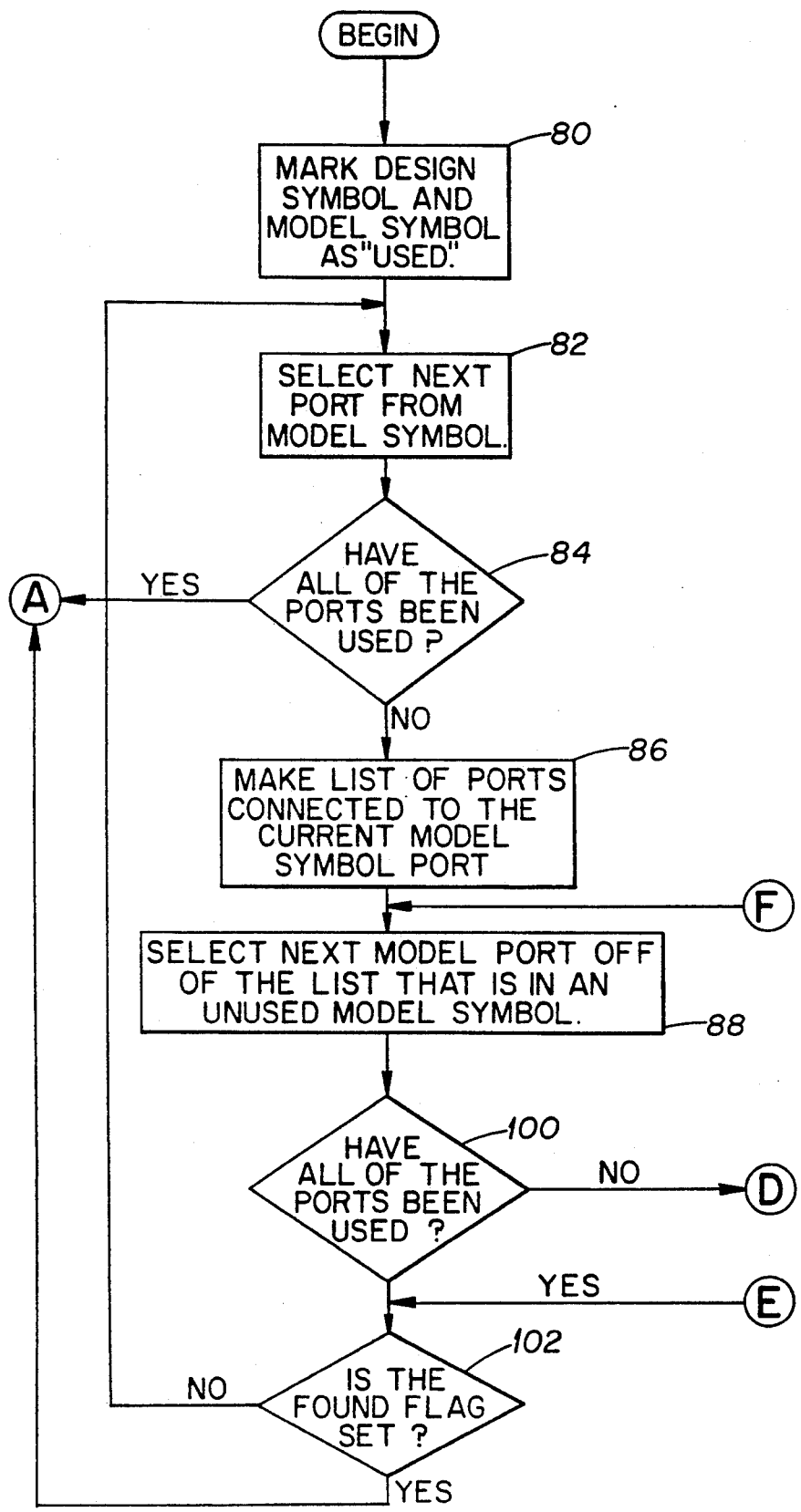
FIG. 9 is a flow chart depicting the steps involved in the perform mapping step (71) of FIG. 8.
Figure 9B:
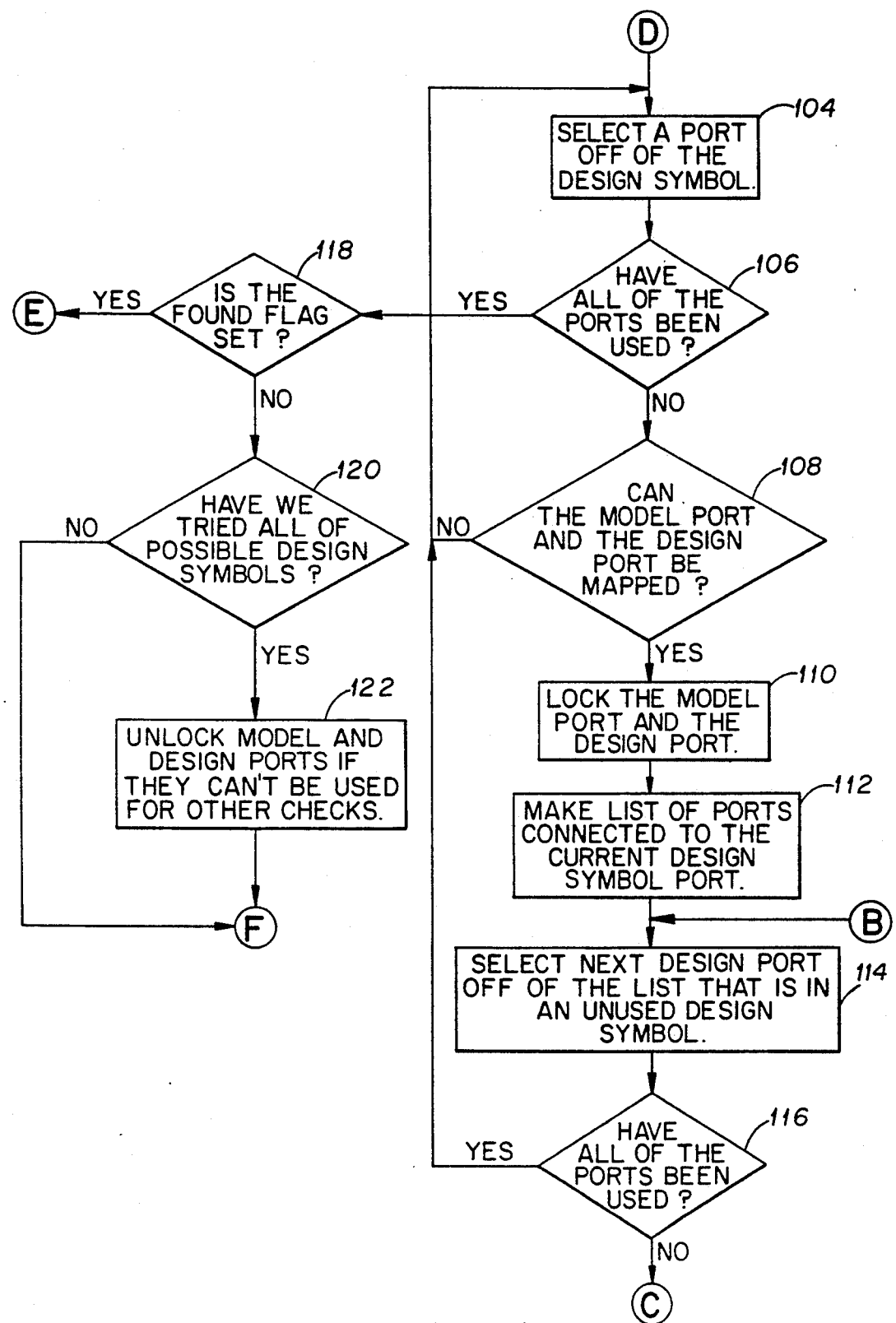
Figure 9C:
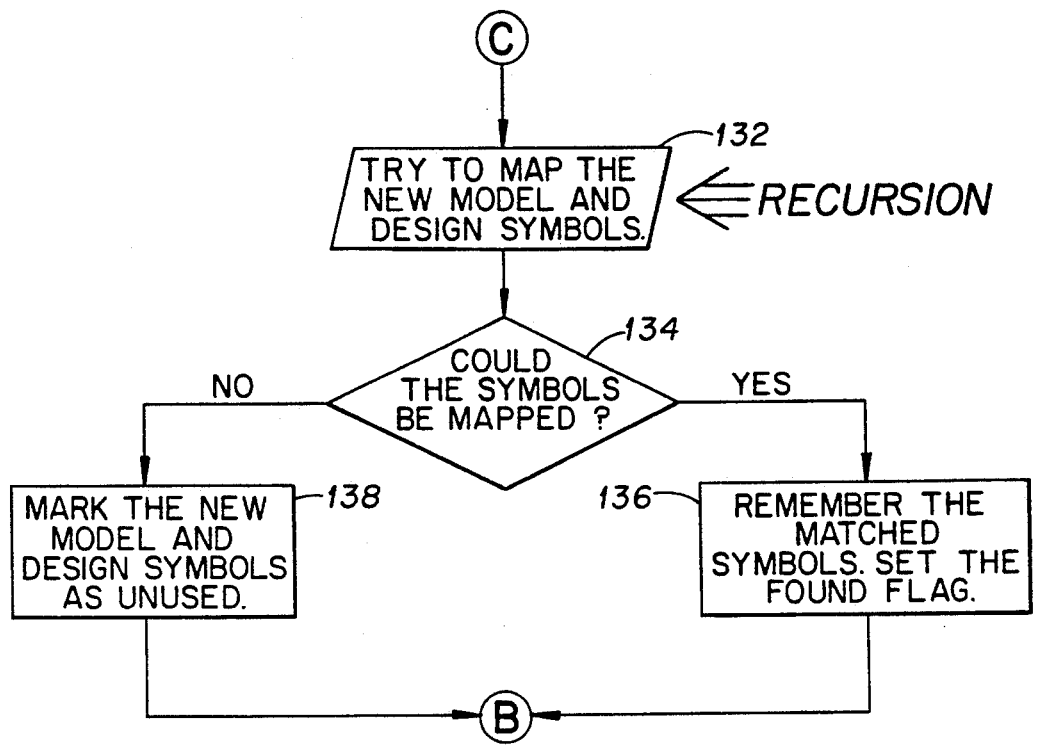
Figure 9D:
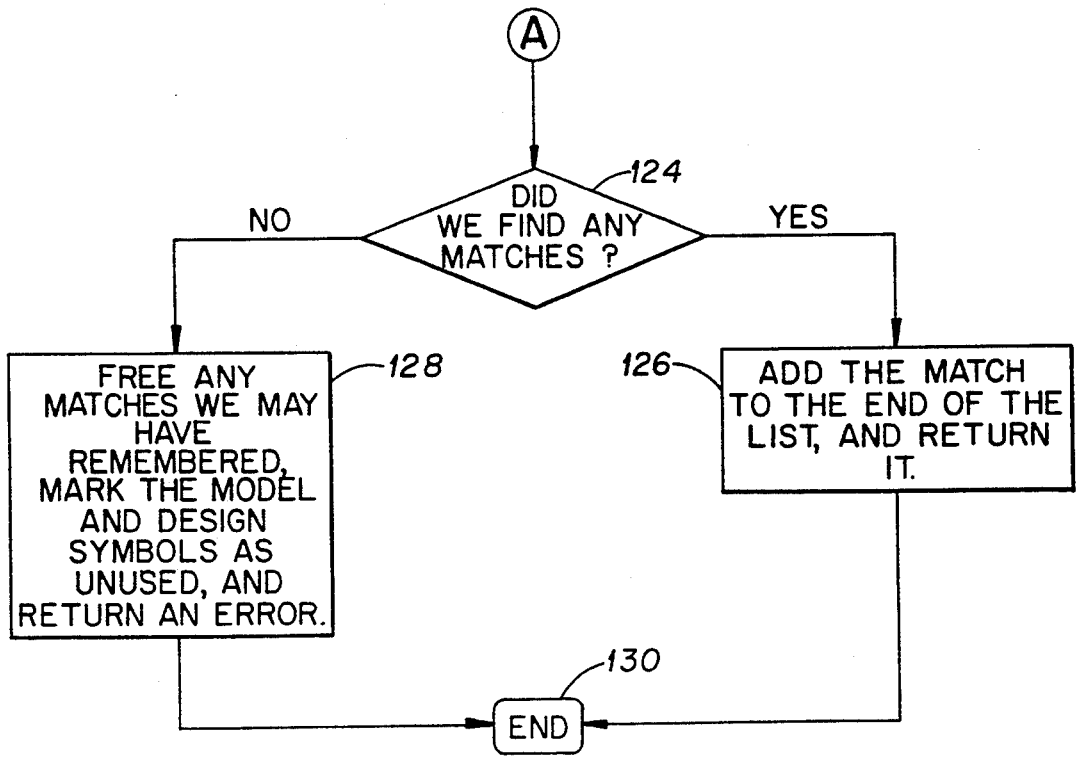

FIG. 9d shows the steps performed by the routine designated as A. In accordance with this routine, the system checks to see if it had found any matches (step 124). If the system has found any matches, it adds the match to the end of a match list and returns the match (step 126). This routine then ends (step 130). In contrast, if it has not found any matches, the system frees any matches that have been remembered and marks the model and design symbols as unused and, in addition, returns an error indication (step 128). This routine then ends (step 130).

If in step 100 all of the ports have not been used, the system branches to the section of the code denoted as D in FIGS. 9a and 9b. FIG. 9b shows the steps performed within the D section of the code. In particular, a port is selected from the current design symbol (step 104). The system then checks to see if all of the ports on this design symbol have been used (step 106). If all of the ports have not been used, the system checks to see if the model port and the design port can be mapped together (step 108). If the model port and the design port can be mapped together, they are designated as "locked" (step 110). The system then proceeds to make a list of ports connected to this design symbol port (step 112). Next, the system selects a next design port off the list of design ports that is on the unused design symbol (step 114). Once again, after selecting this design port. The system checks to see if all of the ports of the design symbol have been used (step 116).

If all of the ports have not been used (as checked in step 116), the system proceeds to the section of the code denoted as C in FIGS. 9b and 9c. In this section of the code as shown in FIG. 9c, the system tries to map the new model symbol together with the design symbol (step 132). The system then checks to see if the symbols can be mapped together (step 134) if the symbols can be mapped together, the system remembers the match symbols and sets the found flag to indicate that a match has been found (step 136). The system then returns to the portion of the code denoted by B in FIGS. 9a and 9c. In particular, it returns to the section of the code in FIG. 9b right before step 114. If, however, the symbols may not be mapped together, the system marks the new model and design models as unused (step 138). It then returns to the routine of FIG. 9b before the step 114. The above discussion pursued the course of events that occurred when the inquiry in step 116 indicates that all of the ports have not been used. However, if all of the ports have been used, the system repeats the routine beginning with step 104.

In step 106 if the inquiry indicates that all of the ports have been used, the system checks to see if the found flag has been set (step 118). If the found flag is set, as checked in step 118, the system returns to the routine of FIG. 9a at the point indicated by E. On the other hand, if the found flag is not set, the system checks to see if it has tried all possible design symbols (step 120). If it has not, it returns to the routine of FIG. 9a at the point indicated by E. If the results of step 120 indicate that all possible design symbols have been tried, system unlocks the model and design ports if they cannot be used for other checks (step 122) and then returns to the routine of FIG. 9a at point F.

The mapping process takes into account function symbols that have symbol ports that can be interchanged when the symbol is placed in the design schematic. For the packaging tool to map a symbol with interchangeable ports, the interchange group number must be the same on all the affected ports, both in the model schematic and the design schematic. Interchange group numbers are assigned to symbol ports when the symbol is created.

When the connectivity check returns successfully, every symbol attached to the original ports on the first selected element in the design and first selected element in the model have been successfully mapped.

The next step in the packaging process is to make packaging assignments (step 56 in FIG. 7). In doing this, the packaging tool packages all preassigned symbols. Furthermore, it also packages the function symbols. To assign pin numbers to symbol ports, the packaging tool looks at the gate property in a model schematic frame symbol and looks at the pin properties on the schematic ports in the model schematic. The packaging tool selects one of the gates and selects the appropriate physical pin name for the pin list for each schematic port. It then back-annotates the physical pin name into the pin property on the corresponding instance of the symbol in the design schematic.

Figure 10:
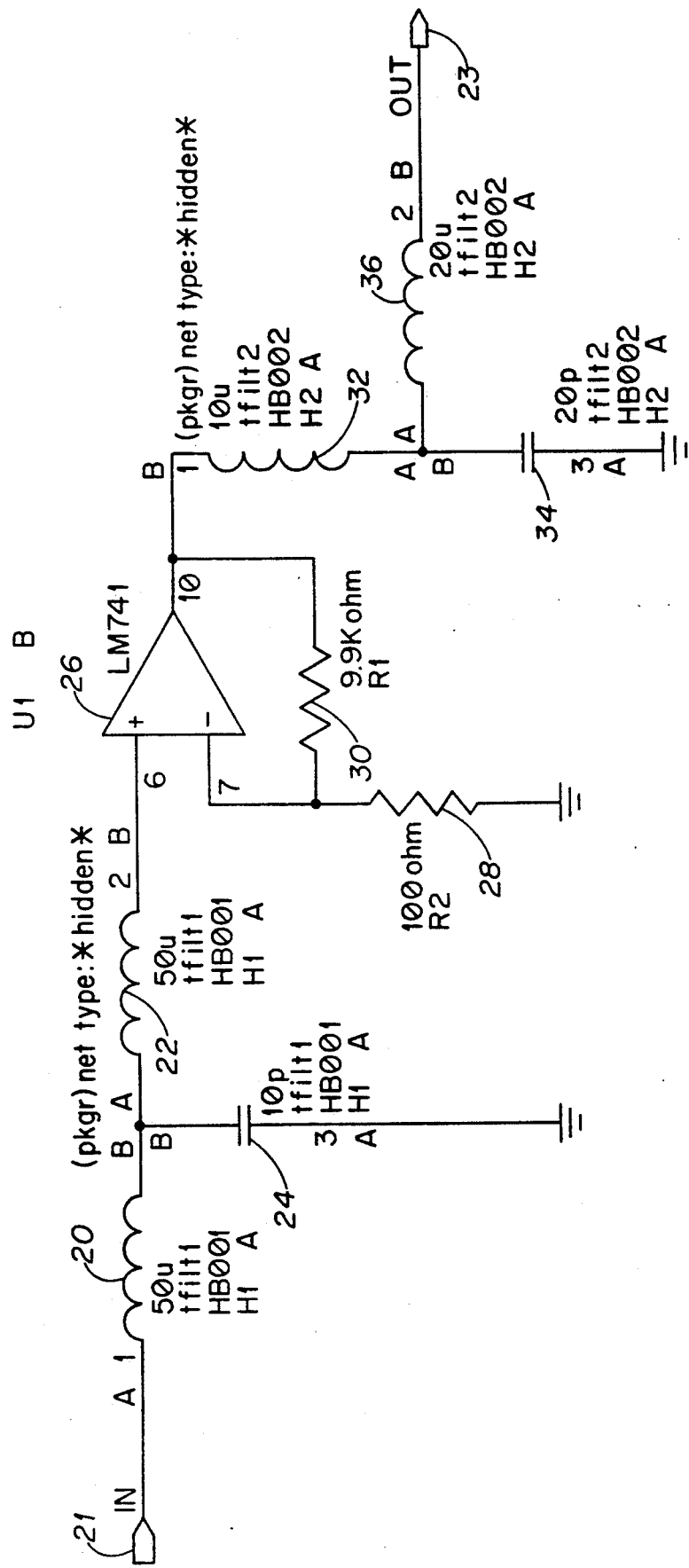
FIG. 10 is a schematic depicting the packaged product of the design of FIG. 3.

Next, the packaging tool frees up memory structures it has used and generates a list of free gates that are not assigned (unused portions of components that have been partially used) (step 58). These unused gates are always the "size" of a model schematic. Lastly, (in step 60) the packaging tool generates a new version of the design that is written out with the new packaged properties. An example of such a packaged design is shown in FIG. 10 for the design schematic of FIG. 3. As can be seen in FIG. 10, a particular package has been assigned to each of the functional symbols.

While the present invention has been shown with reference to preferred embodiments thereof, those skilled in the art will know of various changes in scope and form that may be made without departing from the spirit and scope of the invention as defined in the appended claims.

We claim:

1. A computer aided design system, comprising:
   a) means for creating a design schematic which provides a functional specification of a design for electronic circuitry;
   b) means for creating a plurality of model schematics, each model schematic providing packaging information for a discrete electronic component forming part of the design for electronic circuitry, said model schematic being separate from said design schematic; and
   c) means for mapping the model schematic to the design schematic to generate a packaged design or the design for electronic circuitry, whereby the packaged design is suitable for layout on a printed circuit board.

2. A computer aided design system as recited in claim 1 wherein said design schematic comprises functional symbols representing functions of components in said design.

3. A computer aided design system as recited in claim 2 wherein said design schematic further comprises property values associated with each functional symbol, each said property value providing information defining a function of the associated functional symbol.

4. A computer aided design system as recited in claim 3 wherein the property values of the functional symbols in the design schematic fail to specify packaging information.

5. A computer aided design system as recited in claim 3 wherein the property values of at least one functional symbol in the design schematic specify packaging information.

6. A computer aided design system as recited in claim 1 wherein said model schematic comprises a model symbol representing a particular packaging of functional symbols of a design schematic.

7. A computer aided design system as recited in claim 6 wherein said model schematic further comprises property values associated with said model symbols which provide packaging information regarding said model symbol.

8. A computer aided design system as recited in claim 1 wherein said means for mapping comprises a programmed processing means.

9. A computer aided design system as recited in claim 1 further comprising a display for displaying at least one of the set consisting of: the design schematic, model schematic, and the packaged design.

10. A computer aided design system as recited in claim 1 further comprising means for a user of the system to manually specify a portion of the model schematic to be mapped to a portion of the design schematic by the means for mapping.

11. A computer aided design system as recited in claim 1 further comprising means for the system to automatically specify a portion of the model schematic to be mapped to a portion of the design schematic by the means for mapping.

12. The system of claim 1, wherein a design schematic comprises a plurality of design symbols and a model schematic comprises a plurality of model symbols, each design symbol and each model symbol being assigned a property which associates a design symbol in the design schematic with a model symbol in the model schematic.

13. The system of claim 12, wherein the property for a design symbol identifies whether the design symbol is associated with a preassigned package and wherein the means for mapping automatically assigns the preassigned package associated with a design symbol for each design symbol in the design schematic having a preassigned package.

14. The system of claim 13, wherein a design symbol includes a package model property identifying a type of package assigned to the design symbol.

15. The system of claim 12, wherein the property for a design symbol identifies whether the design symbol is not associated with a presassigned package, and wherein the means for mapping includes means for requiring a user to explicitly assign packaging information for each design symbol in the design schematic not associated with a preassigned package.

16. The system of claim 12, wherein a model schematic is a file that contains packaging and connectively information, for a portion of a design represented by a design schematic, which specifies a plurality of symbols, model gate equivalent generated by the function symbols, and packages containing the gate equivalents.

17. The system of claim 12, wherein the means for mapping includes means for assigning and uniquely identifying for each of the design symbols in the design schematic (i) a package suitable for placement on a circuit board to a design symbol in the design schematic, (ii) a property which identifies a gate of the package for the design symbol and (iii) a property which supplies a pin name for a port of the package for the design symbol.

18. The system of claim 12, wherein the means for packaging the design schematic includes means for comparing a property of each design symbol in the design schematic to a property of each model symbol in the model schematic, until a match of properties is found; and
    means, responsive to a match of properties, for performing a connectivity check to determine if all ports of a model symbol have been used for the design symbol, whereby a model symbol is mapped to a design schematic.

19. A computer implemented method of deferring packaging of a design for electronic circuitry, comprising the steps of:
    a) creating a design schematic which provides a functional specification of the design for electronic circuitry;
    b) creating a plurality of model schematics, each model schematic providing packaging information for a discrete electronic component forming part of the design for electronic circuitry, wherein said model schematic is separate from said design schematic; and
    c) mapping the model schematic to the design schematic to generate a packaged design for the design for electronic circuitry, whereby the packaged design is suitable for layout on a printed circuit board.

20. A method as recited in claim 19 further comprising the step of specifying a portion of the model schematic to be mapped to a portion of the design schematic.

21. A method as recited in claim 20 wherein said specifying step is performed manually.

22. A method as recited in claim 20 wherein said specifying step is performed automatically by the computer.

23. A method as recited in claim 20 wherein said specifying step is performed manually in part and automatically in part by the computer.

24. A method as recited in claim 19 further comprising the steps of identifying a portion of the design for electronic circuitry to be re-packaged and repeating steps b) and c) for said identified portion.

25. The method of claim 19, wherein a design schematic comprises a plurality of design symbols and a model schematic comprises a plurality of model symbols, each design symbol and each model symbol being assigned a property which associates design symbols on the design schematic with a model symbol in the model schematic, wherein the step of mapping includes the step of comparing the property of each design symbol and design schematic to the property of each model symbol in the model schematic, until a match of properties is found, and the step of performing a connectivity check for each matched model symbol and design symbol to determine if all ports of a model symbol have been used for the matched design symbol.

26. A data processing system comprising:
    a) a memory for storing;
       i) a design schematic providing a functional specification of electronic circuitry;
       ii) a plurality of model schematics, each model schematic providing packaging information for a discrete electronic component forming part of the electronic circuitry;
    b) a processing means for generating a packaged design schematic for said electronic circuitry by associating the model schematics to said design schematic, whereby the packaged design is suitable for layout on a printed circuit board; and
    c) a display for displaying at least one of the set consisting of: said design schematic, one of said model schematics and said packaged design schematic.

27. A computer aided design system, comprising:
    a) means for creating a design schematic which provides a functional specification of a design for electronic circuitry, said means for creating being devoid of means requiring specification of packaging information;
    b) means for packaging the design schematic to generate a packaged design having a plurality of discrete electronic components, each component being assigned to a part of said design for electronic circuitry, whereby the packaged design is suitable for layout on a printed circuit board; and
    c) means for layout of said packaged design on a printed circuit board.

28. The system of claim 27, wherein a model schematic has a property that specifies a package name for a package that the model schematic represents, a identifies of a physical package known to a board layout tool, and a property which specifies a number of pins in the package.

29. The system of claim 27, wherein a model schematic includes a property which identifies pins in a package that are not connected, a property which indicates a part number for the package, and a property which lists names of other model schematics that combine to make a component which incorporates the model schematic.

30. The system of claim 27, wherein a model schematic includes properties which identify pins to which power and ground may be connected, and a property used to connect all ports of the same kind in a model schematic to common global nodes.

* * * * *